United States Patent
Hada et al.

(10) Patent No.: US 9,099,315 B2
(45) Date of Patent: Aug. 4, 2015

(54) MOUNTING STRUCTURE AND MOUNTING STRUCTURE MANUFACTURING METHOD

(71) Applicant: INTERNATIONAL BUSINESS MACHINES CORPORATION, Armonk, NY (US)

(72) Inventors: Sayuri Hada, Tokyo (JP); Kei Kawase, Tokyo (JP); Keiji Matsumoto, Kanagawa-ken (JP); Yasumitsu Orii, Shiga-ken (JP); Kazushige Toriyama, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/321,845

(22) Filed: Jul. 2, 2014

(65) Prior Publication Data

US 2015/0021777 A1   Jan. 22, 2015

(30) Foreign Application Priority Data

Jul. 11, 2013   (JP) .................................. 2013-145629

(51) Int. Cl.
*H01L 23/498* (2006.01)
*H01L 23/00* (2006.01)
(Continued)

(52) U.S. Cl.
CPC ............ *H01L 24/05* (2013.01); *H01L 23/3157* (2013.01); *H01L 23/562* (2013.01);
(Continued)

(58) Field of Classification Search
CPC ....... H01L 24/05; H01L 24/03; H01L 23/562; H01L 23/3157; H01L 21/563
USPC ............ 257/679, 692, 762, 777, 781, E23.02, 257/E23.002, E23.068, E21.508, E21.582; 438/109, 594, 613, 614
See application file for complete search history.

(56) References Cited

U.S. PATENT DOCUMENTS 6,798,050 B1 *   9/2004   Homma et al. ............... 257/678
2012/0007228 A1 *  1/2012   Lu et al. ....................... 257/692
(Continued)

FOREIGN PATENT DOCUMENTS

JP   2002-134920     5/2002
JP   2002-158450 A   5/2002
(Continued)

OTHER PUBLICATIONS

EDN Network, [online]; [retrieved on Apr. 1, 2015]; retrieved from the Internet http://www.edn.com/design/components-and-packaging/4374172/Die-to-die-bonding-using-copper-pillars Rich Pell, "Die-to-die bonding using copper pillars," EDN Network, May 30, 2012, pp. 1-4.

*Primary Examiner* — Dao H Nguyen
(74) *Attorney, Agent, or Firm* — Cantor Colburn LLP

(57) ABSTRACT

A mounting structure which reduces the mechanical stress added to a low-κ material due to warping caused by the difference in thermal expansion coefficients between a chip and a chip support during mounting. This mounting structure includes: a low-κ layer formed on top a semiconductor substrate; an electrode layer formed on the low-κ layer; a protective layer formed the low-κ layer and the electrode layer and having an opening reaching the electrode layer; a first solder layer filling the opening and formed on the electrode layer inside; a second solder layer formed on the first solder layer and having an elastic modulus smaller than the first solder layer; and a support layer connected to the second solder layer and supporting the semiconductor substrate. The protective layer has a greater elastic modulus and a smaller thermal expansion coefficient than an underfill layer formed between the protective layer and the support layer.

8 Claims, 6 Drawing Sheets

(51) Int. Cl.
*H01L 21/768* (2006.01)
*H01L 23/31* (2006.01)
*H01L 21/56* (2006.01)

(52) U.S. Cl.
CPC .............. *H01L 24/03* (2013.01); *H01L 21/563* (2013.01); *H01L 2224/03462* (2013.01); *H01L 2224/0401* (2013.01); *H01L 2224/05082* (2013.01); *H01L 2224/05109* (2013.01); *H01L 2224/05111* (2013.01); *H01L 2224/05139* (2013.01); *H01L 2924/01029* (2013.01)

(56) References Cited

U.S. PATENT DOCUMENTS

2014/0291838 A1* 10/2014 Chen et al. .................. 257/737
2014/0306341 A1* 10/2014 Hou et al. .................... 257/737
2014/0367867 A1* 12/2014 Lin et al. ...................... 257/777

FOREIGN PATENT DOCUMENTS

| JP | 2002-324968 A | 11/2002 |
| JP | 2005-317705 A | 11/2005 |
| JP | 2007-273624 A | 10/2007 |
| JP | 2007-335886 A | 12/2007 |
| JP | 2008-140834 A | 6/2008 |
| JP | 2009-194144 A | 8/2009 |
| JP | 2009-224786 A | 10/2009 |
| JP | 2010-109032 A | 5/2010 |
| JP | 11-238954 A | 11/2011 |
| JP | 2012-231140 A | 11/2012 |

* cited by examiner

MOUNTING STRUCTURE AND MOUNTING STRUCTURE MANUFACTURING METHOD

CROSS-REFERENCE TO RELATED APPLICATION

This application claims priority under 35 U.S.C. §119 from Japanese Patent Application No. 2013-145629 filed Jul. 11, 2013, the entire contents of which are incorporated herein by reference.

BACKGROUND OF THE INVENTION

The present invention relates to a semiconductor chip-mounting technique. More specifically, the present invention relates to a semiconductor chip-mounting structure using a low-dielectric constant (low-κ) material and a manufacturing method therefor.

In recent years, as the performance of semiconductor chips has increased, low-κ materials have come to be used in inter-layer insulating films. However, because these materials are porous, they are very brittle and the mechanical stress due to warping caused by the difference in thermal expansion coefficients between a chip and a chip support during mounting causes these materials to become destroyed.

An overview of this problem is shown in FIGS. 1(a) and 1(b). FIG. 1(a) shows the situation during solder connection at the solder solidification temperature and FIG. 1(b) shows the situation during the cooling process. The chip support 11, which has a higher thermal expansion coefficient than the chip 12, is bowed during solder connection and is warped in the opposite direction during the cooling process. The joined portion 10 of a solder bump 13 is enlarged and shown to the right. In the enlarged joined portion 10 a low-κ layer 15 is formed on top of the semiconductor substrate 14 and a wiring layer 16 is formed on the low-κ layer 15. A solder bump 13 is connected to the wiring layer 16 via a barrier layer 17 (such as barrier metal). The mechanical stress due to warping caused by the difference in thermal expansion coefficients between the chip support 11 and the chip 12 causes peeling 18 of the wiring layer 16 connected to the solder bump 13 and peeling of the low-κ layer 15.

As the performance and functionality of semiconductor chips increases, higher currents flow through chips and reliability faults (open defects) occur in the electrode joints due to the electromigration (EM) phenomenon. An early solution to this problem has been to use a solder bump structure including a copper post, such as a column-shaped copper pillar or a platform-shaped copper pedestal. An overview of this solder bump structure is shown in FIGS. 2(a)-2(c).

FIG. 2(a) shows the C4 (controlled collapse chip connection) structure that is currently in use. A low-κ layer 15 is formed on top of a semiconductor substrate 14 and a protective layer 22 is formed on top of the low-κ layer 15. A solder bump 13 is connected via a UBM (under bump metallurgy) layer 21 to an electrode formed on top of the low-κ layer 15.

FIG. 2(b) shows a solder bump structure including a copper pillar. The copper pillar 24 is formed on top of a UBM layer 21 and the copper pillar 24 is connected via the UBM layer 21 to an electrode 23 formed on top of the low-κ layer 15.

FIG. 2(c) shows a solder bump structure including a copper pedestal. The copper pedestal 25 is formed on top of a UBM layer 21 and the copper pedestal 25 is connected via the UBM layer 21 to an electrode 23 formed on top of the low-κ layer 15. A solder bump 13 is formed on top of the copper pedestal 25.

In solder bump structures (b) and (c) having copper posts, the hardness of the bump is increased. As a result, the stress added to the low-κ layer 15 made of a material with a low dielectric constant is greater than in a conventional structure (a) made of solder alone. This makes defects such as peeling of the low-κ layer 15 more likely during mounting.

A method for reducing the stress added to a low-κ layer has been proposed, as shown in FIG. 3, in which the thickness of the protective layer 32 supporting the UBM layer 31 underneath the copper post 33 has been increased. However, it is difficult to form the UBM layer 31 when the thickness of the protective layer 32 is increased, so this proposed method entails manufacturing problems.

In the prior art, rewiring so as to electrically connect a semiconductor element arranged beneath a bump electrode is configured using a plating method and the rewiring is covered with a surface-protecting film.

SUMMARY OF THE INVENTION

Accordingly, one aspect of the present invention provides a mounting structure including: a low-κ layer formed on top of a semiconductor substrate; an electrode layer formed on top of the low-κ layer; a protective layer formed on top of the low-κ layer and the electrode layer and having an opening reaching the electrode layer; a first solder layer filling the opening and formed on top of the electrode layer inside the opening; a second solder layer formed on top of the first solder layer and having an elastic modulus smaller than the first solder layer; and a support layer connected to the second solder layer and supporting the semiconductor substrate; wherein the protective layer has a greater elastic modulus and a smaller thermal expansion coefficient than an underfill layer formed between the protective layer and the support layer.

Another aspect of the present invention provides a method for manufacturing a mounting structure, the method including: forming a low-κ layer on top of a semiconductor substrate; forming an electrode layer on top of the low-κ layer; forming a protective layer on top of the low-κ layer and the electrode layer; forming a mask layer with an opening pattern on top of the protective layer; forming an opening on the protective layer that reaches the electrode layer using the mask layer; filling the opening and forming a first solder layer on top of the electrode layer inside the opening; removing the mask layer; forming a second solder layer having an elastic modulus smaller than the first solder layer on top of the first solder layer; and connecting the second solder layer to a support layer supporting the semiconductor substrate; wherein the protective layer has a greater elastic modulus and a smaller thermal expansion coefficient than an underfill layer formed between the protective layer and the support layer.

BRIEF DESCRIPTION OF THE DRAWINGS

FIG. 1(a) shows the situation during solder connection at the solder solidification temperature; and FIG. 1(b) shows the situation during the cooling process.

FIG. 2(a) shows the C4 structure that is currently in use;

FIG. 2(b) shows a solder bump structure including a copper pillar; and

FIG. 2(c) shows a solder bump structure including a copper pedestal.

in FIG. 8(a) a low-κ layer 15 is formed on top of a semiconductor substrate 14, an electrode layer (not shown) is formed on top of the low-κ layer 15, and a protective layer 50 is formed on top of the low-κ layer 15;

in FIG. 8(b) a mask layer 80 with an opening pattern is formed on top of the protective layer 50 and the mask layer 80 is used to form an opening 81 in the protective layer 50 which reaches the electrode layer;

in FIG. 8(c) the interior of the opening 81 on top of the electrode layer is filled with a first solder layer 41 of tin (Sn) and silver (Ag);

in FIG. 8(d) the mask layer 50 is removed; and in FIG. 8(e) a second solder layer 42 of indium (In) is formed on top of the first solder layer 41.

DETAILED DESCRIPTION OF THE PREFERRED EMBODIMENT

Figure 1A:
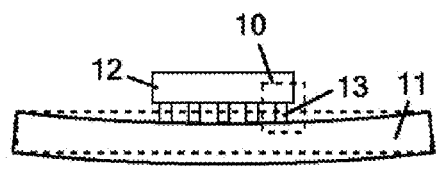
FIGS. 1(a) and 1(b) are diagrams showing an overview of a phenomenon in which a low-κ layer material is destroyed by mechanical stress due to warping caused by the difference in thermal expansion coefficients between a chip and a chip support during mounting. More specifically.
Figure 1B:
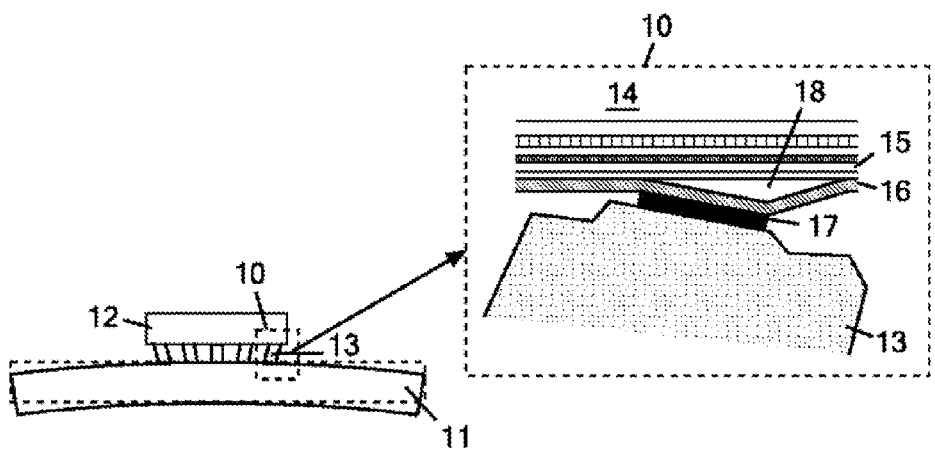
Figure 2A:
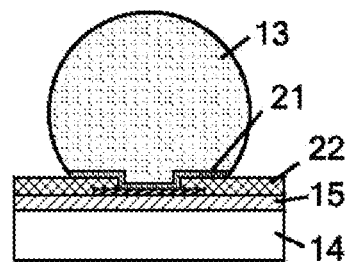
FIGS. 2(a)-2(c) are diagrams schematically illustrating solder bumps having a copper post. More specifically.
Figure 2B:
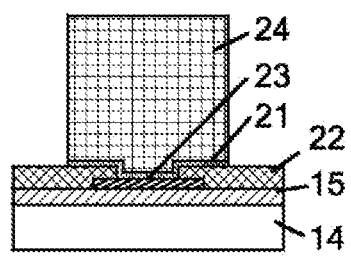
Figure 2C:
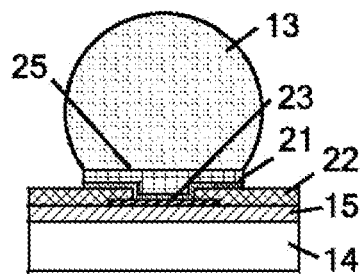
Figure 3:
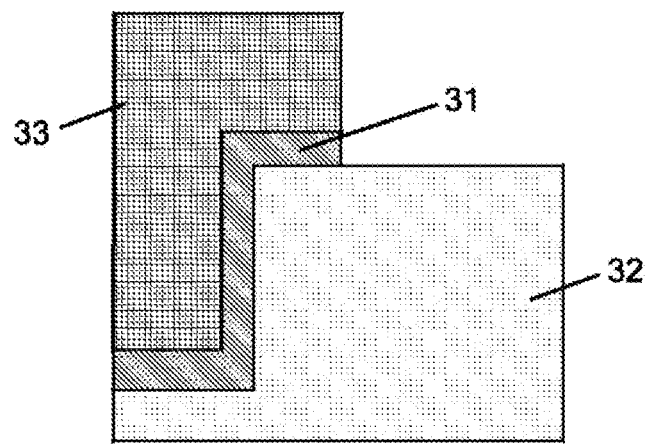
FIG. 3 is a diagram schematically illustrating a solder bump having a copper post and a thicker protective layer.

An object of the present invention realizes a mounting structure which reduces the mechanical stress added to a low-κ material due to warping caused by the difference in thermal expansion coefficients between a chip and a chip support during mounting. The present invention includes providing both this mounting structure and a manufacturing method for this mounting structure.

The mounting structure provided in one aspect of the present invention includes: a low-κ layer formed on top of a semiconductor substrate; an electrode layer formed on top of the low-κ layer; a protective layer formed on top of the low-κ layer and the electrode layer and having an opening reaching the electrode layer; a first solder layer filling the opening and formed on top of the electrode layer inside the opening; a second solder layer formed on top of the first solder layer and having an elastic modulus smaller than the first solder layer; and a support layer connected to the second solder layer and supporting the semiconductor substrate. The protective layer has a greater elastic modulus and a smaller thermal expansion coefficient than an underfill layer formed between the protective layer and the support layer.

In the support structure, an underfill layer is preferably formed between the protective layer and the support layer. In the mounting structure, the protective layer is preferably made of the same material as the support layer. In the mounting structure, the protective layer is preferably made of polyimide or silicon oxide. In the mounting structure, the first solder layer is preferably made of tin (Sn) and silver (Ag) and the second solder layer is preferably made of indium (In).

The mounting structure manufacturing method provided in one aspect of the present invention includes the steps of: forming a low-κ layer on top of a semiconductor substrate; forming an electrode on top of the low-κ layer; forming a protective layer on top of the low-κ layer and the electrode layer; forming a mask layer with an opening pattern on top of the protective layer; forming an opening on the protective layer that reaches the electrode layer using the mask layer; filling the opening and forming a first solder layer on top of the electrode layer inside the opening; removing the mask layer; forming a second solder layer having an elastic modulus smaller than the first solder layer on top of the first solder layer; and connecting the second solder layer to a support layer supporting the semiconductor substrate. The protective layer has a greater elastic modulus and a smaller thermal expansion coefficient than an underfill layer formed between the protective layer and the support layer.

In the manufacturing method, the underfill layer is preferably formed between the protective layer and the support layer. In the manufacturing method, formation of the opening in the protective layer preferably includes irradiation of the protective layer with a laser to form the opening. In the manufacturing method, formation of the first solder layer preferably includes filling the opening with the first solder using injection-molding soldering. In the manufacturing method, formation of the second solder layer preferably includes electroplating the first solder layer with the second solder.

The present invention realizes a mounting structure which reduces the mechanical stress added to a low-κ material due to warping caused by the difference in thermal expansion coefficients between a chip and a chip support during mounting. More specifically, the elasticity modulus and thermal expansion coefficient of a protective layer formed on top of a low-κ layer are specified with respect to an underfill layer, the elasticity modulus of a second solder layer formed on top of a first solder layer is specified with respect to a first solder layer, the protective layer specified in this way is formed on top of the low-κ layer, the opening in the protective layer is filled by the first solder layer, and the second solder layer specified in this way is formed on top of the first solder layer. This reduces the mechanical stress added to the low-κ layer and prevents destruction of the mounting structure such as peeling of the low-κ layer.

The following is an explanation of a preferred embodiment of the present invention with reference to the drawings. However, this embodiment does not limit the present invention as described in the scope of the claims and all combinations of characteristics explained in the embodiment are not necessarily required in the technical solution of the present invention. The present invention can be embodied in many different ways and is by no means limited to the content of the embodiment described below. In the entire explanation of the embodiment, identical elements are denoted by the same numbers.

Figure 4:
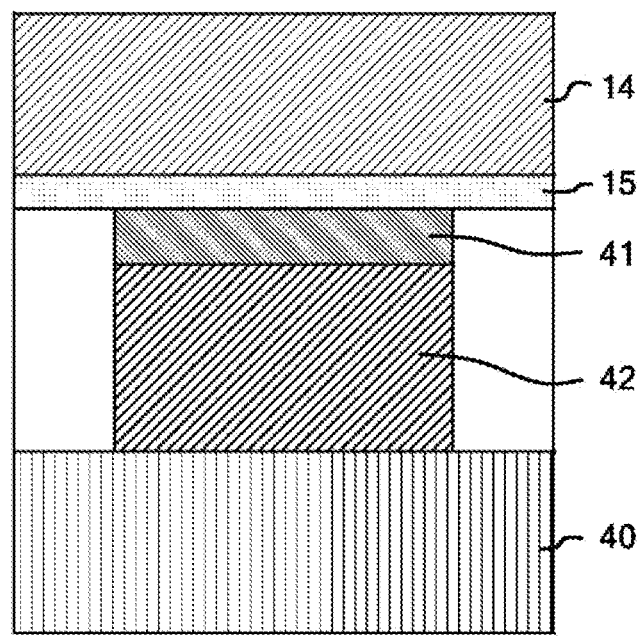
FIG. 4 is a diagram schematically illustrating a mounting structure in which a first solder layer and a second solder layer are formed in successive order on top of a low-κ layer.

FIG. 4 is a diagram schematically illustrating a mounting structure in which a first solder layer and a second solder layer are formed in successive order on top of a low-κ layer. This structure is to be compared to the configuration of a mounting structure according to an embodiment of the present invention. In this mounting structure, a low-κ layer 15 is formed on top of a semiconductor substrate 14, a first solder layer 41 made of tin (Sn) and silver (Ag) having an elasticity modulus or Young's modulus of, for example, 40 GPa, and a second solder layer 42 made of indium (In) having an elasticity modulus or Young's modulus of, for example, 11 GPa, which is lower than the elasticity modulus of the first solder layer 41, are formed in successive order on top of the low-κ layer 15. The electrode layer, UBM layer, and copper post formed on top of the low-κ layer 15 have been omitted and are not shown. However, even if these are formed, they would be covered by the first solder layer 41. The second solder layer 42 is connected to a support layer 40 similar to the chip support 11. In this mounting structure, an underfill layer is not formed around the first solder layer 41 and the second solder layer 42.

Figure 5:
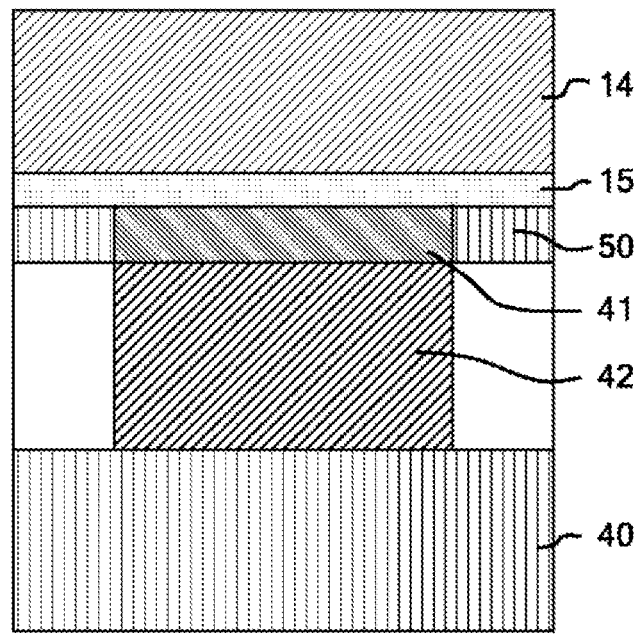
FIG. 5 is a diagram schematically illustrating a mounting structure in which an opening is formed in a protective layer having a greater elasticity modulus and smaller thermal expansion coefficient than the underfill layer, the opening is filled by a first solder layer, and a second solder layer having a smaller thermal expansion coefficient than the first solder layer is formed on top of the first solder layer to complete an embodiment of the present invention.

FIG. 5 is a diagram schematically illustrating the configuration of a mounting structure according to an embodiment of the present invention. In this mounting structure, a low-κ layer 15 is formed on top of a semiconductor substrate 14 and a protective layer 50 is formed on top of the low-κ layer 15, which is made, for example, of polyimide or silicon oxide that has a greater elasticity modulus and a smaller thermal expansion coefficient than the underfill layer. An opening is formed in the protective layer 50 at a location in which the electrode layer, UBM layer and copper post formed on top of the low-κ layer 15 are present. The first solder layer 41 is formed in the opening to the low-κ layer 15 and fills said opening. As in the case of the mounting structure shown in FIG. 4, a second solder layer 42 having an elasticity modulus smaller than the first solder layer 41 is formed on top of the first solder layer 41. The second solder layer 42 is connected to a support layer 40 similar to the chip support 11. Because the first solder layer 41 in this mounting structure is surrounded by a protective layer 50, which has a greater elasticity modulus and a smaller thermal expansion coefficient than the underfill layer, the mechanical stress added to the low-κ layer 15 is reduced. In this mounting structure an underfill layer is not formed around the second solder layer 42.

Figure 6:
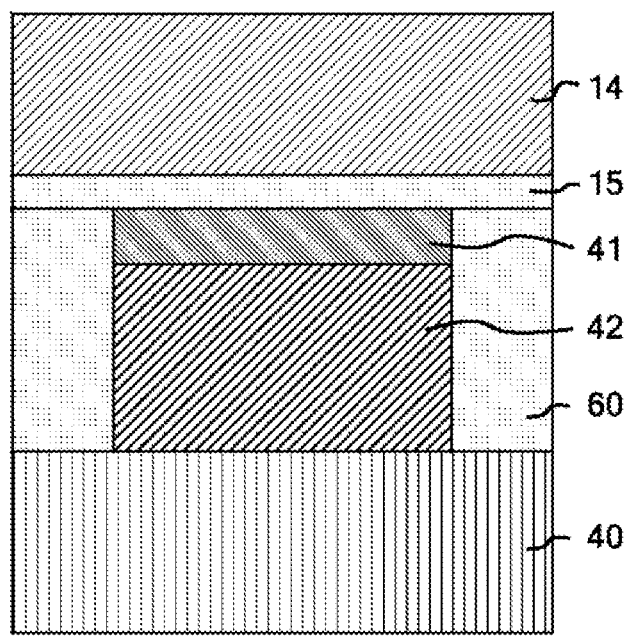
FIG. 6 is a diagram schematically illustrating a mounting structure in which an underfill layer has been formed in the mounting structure shown in FIG. 4 according to an embodiment of the present invention.

FIG. 6 is a diagram schematically illustrating a mounting structure in which an underfill layer has been formed in the mounting structure shown in FIG. 4. This structure is to be compared to the configuration of a mounting structure in another embodiment of the present invention. In this mounting structure, as in the case of the mounting structure shown in FIG. 4, a protective layer 50 is not formed on top of the low-κ layer 15, which is made, for example, of polyimide or silicon oxide having a greater elasticity modulus and a smaller thermal expansion coefficient than the underfill layer. However, unlike the mounting structure in FIG. 4, an underfill layer 60 is formed between the low-κ layer 15 and the support layer 40. Because the other constituent elements are the same, the mounting structure in FIG. 4 can be referenced.

Figure 7:
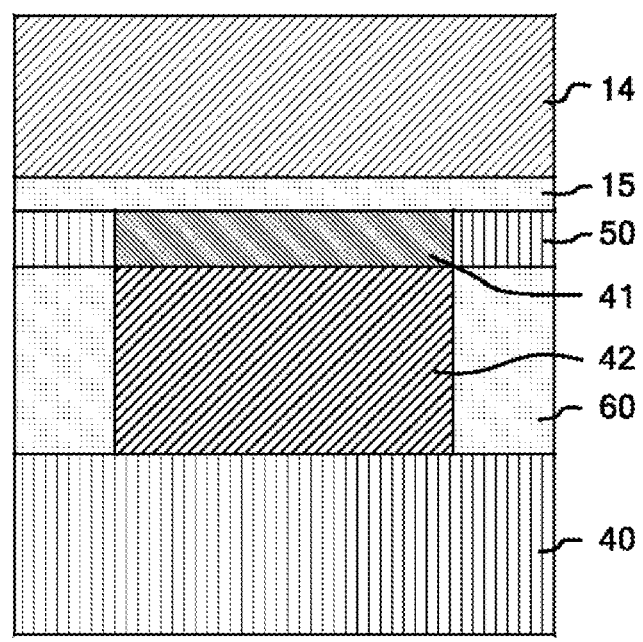
FIG. 7 is a diagram schematically illustrating a mounting structure in which an underfill layer has been formed in the mounting structure shown in FIG. 5 according to an embodiment of the present invention.
Figure 8A:
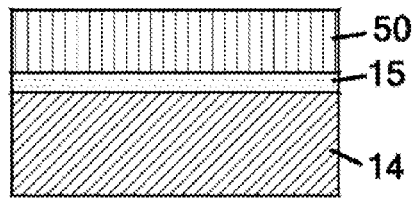
FIGS. 8(a)-8(e) are diagrams schematically illustrating the processing steps in a method for manufacturing a mounting structure according to an embodiment of the present invention. More specifically.
Figure 8B:
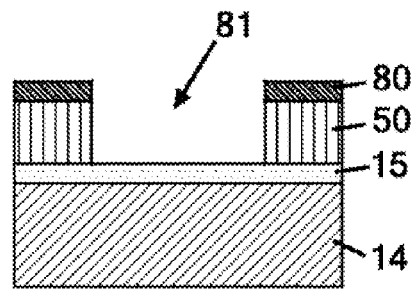
Figure 8C:
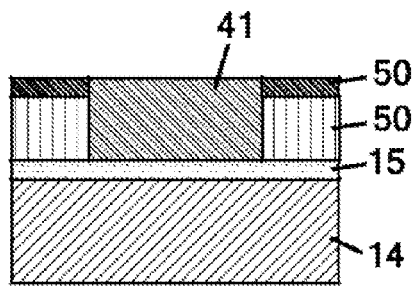
Figure 8D:
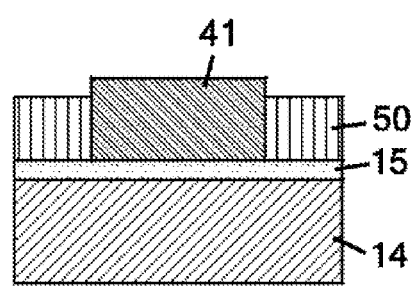
Figure 8E:
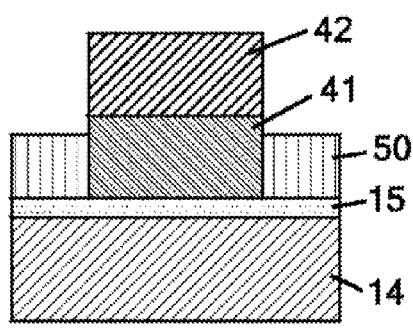

FIG. 7 is a diagram schematically illustrating the mounting structure in another embodiment of the present invention. In addition to the mounting structure in FIG. 5, this mounting structure includes the formation of an underfill layer 60 between the protective layer 50 and the support layer 40. Also, in this mounting structure, a low-κ layer 15 is formed on top of a semiconductor substrate 14 and a protective layer 50 is formed on top of the low-κ layer 15, which is made, for example, of polyimide or silicon oxide that has a greater elasticity modulus and a smaller thermal expansion coefficient than the underfill layer 60. An opening is formed in the protective layer 50 at a location in which the electrode layer, UBM layer and copper post formed on top of the low-κ layer 15 are present. The first solder layer 41 is formed in the opening to the low-κ layer 15 and fills said opening. A second solder layer 42 having an elasticity modulus smaller than the first solder layer 41 is formed on top of the first solder layer 41. The second solder layer 42 is connected to a support layer 40 similar to the chip support 11. Because the first solder layer 41 in this mounting structure is surrounded by a protective layer 50, which has a greater elasticity modulus and a smaller thermal expansion coefficient than the underfill layer 60, and the second solder layer 42 having an elasticity modulus smaller than the first solder layer 41 is surrounded by the underfill layer 60, the mechanical stress added to the low-κ layer 15 is reduced even more than in the mounting structure shown in FIG. 5.

In each mounting structure in FIG. 4 through FIG. 7, the stress added to the low-κ layer was simulated using the finite element method. The results are shown in Table 1.

TABLE 1

| Structure | 1st | 2nd | 3rd | 4th |
| --- | --- | --- | --- | --- |
| Stress Added to low-κ Layer (MPa) | 154.9 | 85.1 | 35.8 | 24.3 |
| Stress Added to low-κ Layer (Relative Comparison) | 1 | 0.55 | 0.23 | 0.16 |
| Distortion on 1st Solder Layer | $2.96 \times 10^{-3}$ | $2.34 \times 10^{-3}$ | $1.95 \times 10^{-3}$ | $1.90 \times 10^{-3}$ |
| Distortion on 2nd Solder Layer | $6.12 \times 10^{-3}$ | $6.44 \times 10^{-3}$ | $5.63 \times 10^{-3}$ | $5.63 \times 10^{-3}$ |

The mounting structure in FIG. 4 is shown in the first column in Table 1. The stress added to the low-κ layer (in the direction of thickness) is 154.9 MPa. Because this value is used as the point of reference, the relative comparative value for the stress added to the low-κ layer is 1. The distortion (volume average) of the first solder layer made of tin-silver (SnAg) is $2.96 \times 10^{-3}$ and the distortion (volume average) of the second solder layer made of indium (In) is $6.12 \times 10^{-3}$.

The mounting structure in FIG. 5 is shown in the second column in Table 1. The stress added to the low-κ layer (in the direction of thickness) is 85.1 MPa and the relative comparative value for the stress added to the low-κ layer is 0.55. By forming a protective film having a greater elasticity modulus and a smaller thermal expansion coefficient than the underfill layer on top of the low-κ layer even when the underfill layer has not been formed (that is, before the underfill layer has been formed) the mounting structure in the embodiment of the present invention shown in FIG. 5 can be reduced to nearly half the stress added to low-κ layer as the mounting structure in FIG. 4. The distortion (volume average) of the first solder layer made of tin-silver (SnAg) is $2.34 \times 10^{-3}$ and the distortion (volume average) of the second solder layer made of indium (In) is $6.44 \times 10^{-3}$. The distortion of the first solder layer is somewhat lower and the distortion of the second solder layer is somewhat higher.

The mounting structure in FIG. 6 is shown in the third column in Table 1. The stress added to the low-κ layer (in the direction of thickness) is 35.8 MPa and the relative comparative value for the stress added to the low-κ layer is 0.23. When an underfill layer is formed, the stress added to the low-κ layer is reduced by an additional 20% compared to the mounting structure shown in FIG. 4 in which an underfill layer has not been formed. The stress added to the low-κ layer is significantly reduced when an underfill layer is formed. However, even when an underfill layer is formed, destruction of the structure such as peeling of the low-κ layer has to be taken into account. Therefore, it is important to further reduce stress added to the low-κ layer when an underfill layer has been formed. The distortion (volume average) of the first solder layer made of tin-silver (SnAg) is $1.95 \times 10^{-3}$ and the distortion (volume average) of the second solder layer made of indium (In) is $5.63 \times 10^{-3}$. The distortion of the first solder layer and the distortion of the second solder layer are lower than in the mounting structures shown in FIG. 4 and FIG. 5.

The mounting structure in FIG. 7 is shown in the fourth column in Table 1. The stress added to the low-κ layer (in the direction of thickness) is 24.3 MPa and the relative comparative value for the stress added to the low-κ layer is 0.16. In the mounting structure according to another embodiment of the present invention shown in FIG. 7, a protective layer having a greater elasticity modulus and a smaller thermal expansion coefficient than the underfill layer is formed on top of the low-κ layer after the underfill layer has been formed. This reduces the stress added to the low-κ layer by approximately 30% (24.3 MPa) compared to the mounting structure shown in FIG. 6 (35.8 MPa). The distortion (volume average) of the first solder layer made of tin-silver (SnAg) is $1.90 \times 10^{-3}$ and the distortion (volume average) of the second solder layer made of indium (In) is $5.63 \times 10^{-3}$. The distortion of this first solder layer is the lowest, and the distortion of this second solder layer is also lowest but about the same as in the mounting structure shown in FIG. 6.

FIGS. 8(a)-8(e) are diagrams schematically illustrating the processing steps in a method for manufacturing a mounting structure according to an embodiment of the present invention. In this manufacturing method, as shown in FIG. 8 (a), a low-κ layer 15 is formed on top of a semiconductor substrate 14, an electrode layer (not shown) is formed on top of the low-κ layer 15, and a protective layer 50 is formed on top of the low-κ layer 15, which is made, for example, of polyimide or silicon oxide that has a greater elasticity modulus and a smaller thermal expansion coefficient than the underfill layer.

In the manufacturing method, as shown in FIG. 8 (b), a mask layer 80 with an opening pattern is formed on top of the protective layer 50, and the mask layer 80 is used to form an opening 81 in the protective layer 50 which reaches the electrode layer. Preferably, a laser is used to form the opening 81 in the protective layer 50.

In the manufacturing method, as shown in FIG. 8 (c), the interior of the opening 81 on top of the electrode layer is filled with a first solder layer 41 of tin (Sn) and silver (Ag) which has, for example, an elasticity modulus or Young's modulus of 40 GPa. Preferably, the first solder layer 41 is formed by filling the opening 81 with the first solder using injection-molding soldering.

In the manufacturing method, as shown in FIG. 8 (d), the mask layer 50 is removed. In the manufacturing method, as shown in FIG. 8 (e), a second solder layer 42 of indium (In) which has, for example, an elasticity modulus or Young's modulus of 11 GPa that is smaller than that of the first solder layer 41 is formed on top of the first solder layer 41. Preferably, the second solder layer 42 is formed by electroplating the first solder layer 41 with the second solder.

In the manufacturing method, though not shown in FIGS. 8(a)-8(e), the second solder layer 42 is connected to a support layer 40 supporting the semiconductor substrate 14. In the manufacturing method an underfill layer 60 is preferably formed between the protective layer 50 and the support layer 40.

The present invention was explained above using an embodiment of the present invention, but the technical scope of the present invention is not limited in any way by this embodiment. It should be clear that various types of modifications and improvements can be made to the embodiment and that these modifications and improvements are included within the technical scope of the present invention.

We claim:

1. A mounting structure comprising:
   a low-κ layer formed on top of a semiconductor substrate;
   an electrode layer formed on top of the low-κ layer;
   a protective layer formed on top of the low-κ layer and the electrode layer and having an opening reaching the electrode layer;
   a first solder layer filling the opening and formed on top of the electrode layer inside the opening;
   a second solder layer formed on top of the first solder layer and having an elastic modulus smaller than the first solder layer; and
   a support layer connected to the second solder layer and supporting the semiconductor substrate;
   wherein the protective layer has a greater elastic modulus and a smaller thermal expansion coefficient than an underfill layer formed between the protective layer and the support layer; and
   wherein side surfaces of the first solder layer are completely surrounded by the protective layer, while side surfaces of the second solder layer are completely surrounded by the underfill layer.

2. The mounting structure according to claim 1, wherein the protective layer is made of a same material as the support layer.

3. The mounting structure according to claim 1, wherein the protective layer is made of a polyimide or a silicon oxide.

4. The mounting structure according to claim 1, wherein the first solder layer is made of a tin (Sn) and a silver (Ag); and the second solder layer is made of indium (In).

5. A method for manufacturing a mounting structure, the method comprising:
   forming a low-κ layer on top of a semiconductor substrate;
   forming an electrode layer on top of the low-κ layer;
   forming a protective layer on top of the low-κ layer and the electrode layer;
   forming a mask layer with an opening pattern on top of the protective layer;
   forming an opening on the protective layer that reaches the electrode layer using the mask layer;
   filling the opening and forming a first solder layer on top of the electrode layer inside the opening;
   removing the mask layer;
   forming a second solder layer having an elastic modulus smaller than the first solder layer on top of the first solder layer; and
   connecting the second solder layer to a support layer supporting the semiconductor substrate;
   wherein the protective layer has a greater elastic modulus and a smaller thermal expansion coefficient than an underfill layer formed between the protective layer and the support layer; and
   wherein side surfaces of the first solder layer are completely surrounded by the protective layer, while side surfaces of the second solder layer are completely surrounded by the underfill layer.

6. The manufacturing method according to claim 5, wherein the formation of the opening in the protective layer includes irradiation of the protective layer with a laser to form the opening.

7. The manufacturing method according to claim 5, wherein formation of the first solder layer includes filling the opening with the first solder using injection-molding soldering.

8. The manufacturing method according to claim 5, wherein formation of the second solder layer includes electroplating the first solder layer with the second solder.

* * * * *